United States Patent [19]

Vitriol et al.

[11] Patent Number: 5,028,473
[45] Date of Patent: Jul. 2, 1991

[54] THREE DIMENSIONAL MICROCIRCUIT STRUCTURE AND PROCESS FOR FABRICATING THE SAME FROM CERAMIC TAPE

[75] Inventors: William A. Vitriol, Anaheim; Gary W. Johnson, Irvine, both of Calif.

[73] Assignee: Hughes Aircraft Company, Los Angeles, Calif.

[21] Appl. No.: 415,514

[22] Filed: Oct. 2, 1989

[51] Int. Cl.$^5$ .............................................. B32B 3/00
[52] U.S. Cl. .................................. 428/137; 428/209; 428/426; 428/433; 428/457; 428/901; 428/192; 156/89; 361/397; 361/398
[58] Field of Search ............... 428/137, 209, 426, 433, 428/457, 901; 156/89; 361/397; 174/68.5

[56] References Cited

U.S. PATENT DOCUMENTS 4,645,552  2/1987  Vitriol et al. ......................... 156/89
4,786,342  11/1988 Zellner et al. ...................... 156/231

OTHER PUBLICATIONS

Tape Transfer Tech—1989, Intl. Journal Hybrid Microelectronics; vol. 12, No. 3, 9/89.

Primary Examiner—Patrick J. Ryan
Attorney, Agent, or Firm—Terje Gudmestad; Jeannette M. Walder; W. K. Denson-Low

[57] ABSTRACT

An electrical circuit pattern is formed on a glass-ceramic, thermally fusible tape. The tape is heated to a temperature at which it becomes temporarily plastic, and is then bent into a desired non-planar shape. Further application of heat causes the tape to be sintered in the non-planar shape. A multi-layer structure can be provided by laminating plural layers of Low-Temperature-Cofired-Ceramic (LTCC) tape with respective circuit patterns formed thereon together, and plastically bending the laminated structure into the non-planar shape during the heating step. A circuit structure including an edge connector can be formed by laminating a layer of glass-ceramic transfer tape having an electrical circuit pattern which includes conductor strips formed on an edge connector portion thereof onto a relatively rigid substrate, such that the edge connector portion is bent around an edge of the substrate to form a rigid edge connector. The edge connector portion of the transfer tape which is formed into a non-planar shape during the lamination step, is fused together with the remaining portion of the transfer tape onto the substrate during the heating step.

30 Claims, 5 Drawing Sheets

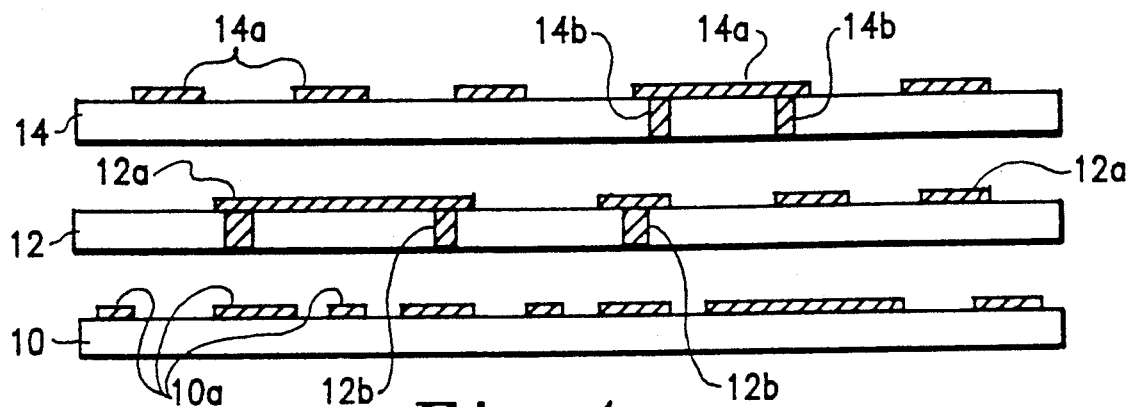
Fig.1.a.
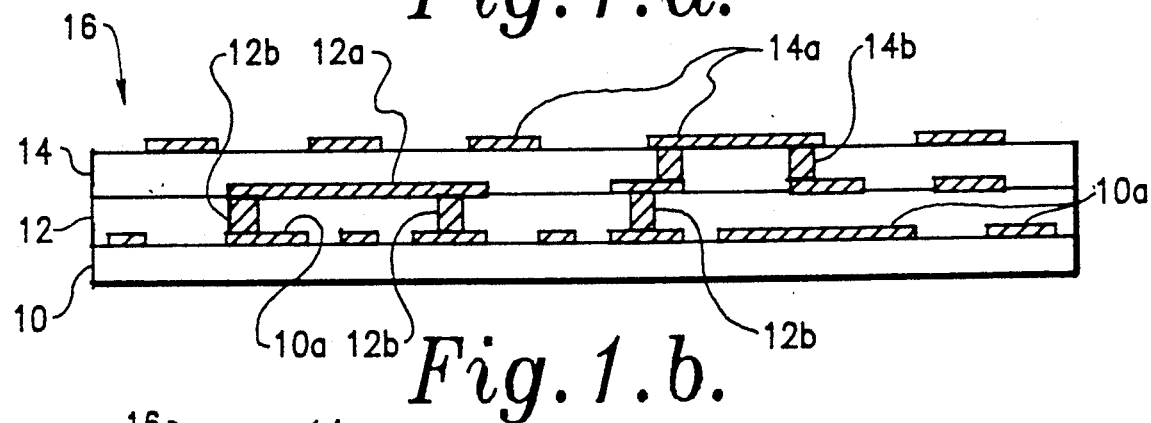
Fig.1.b.
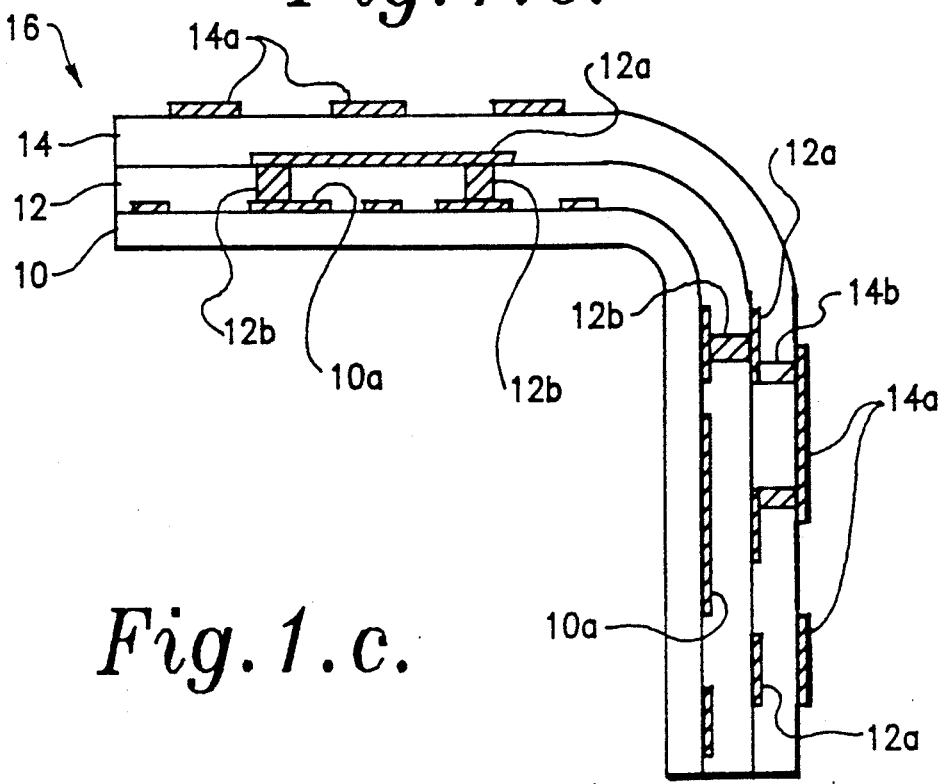
Fig.1.c.

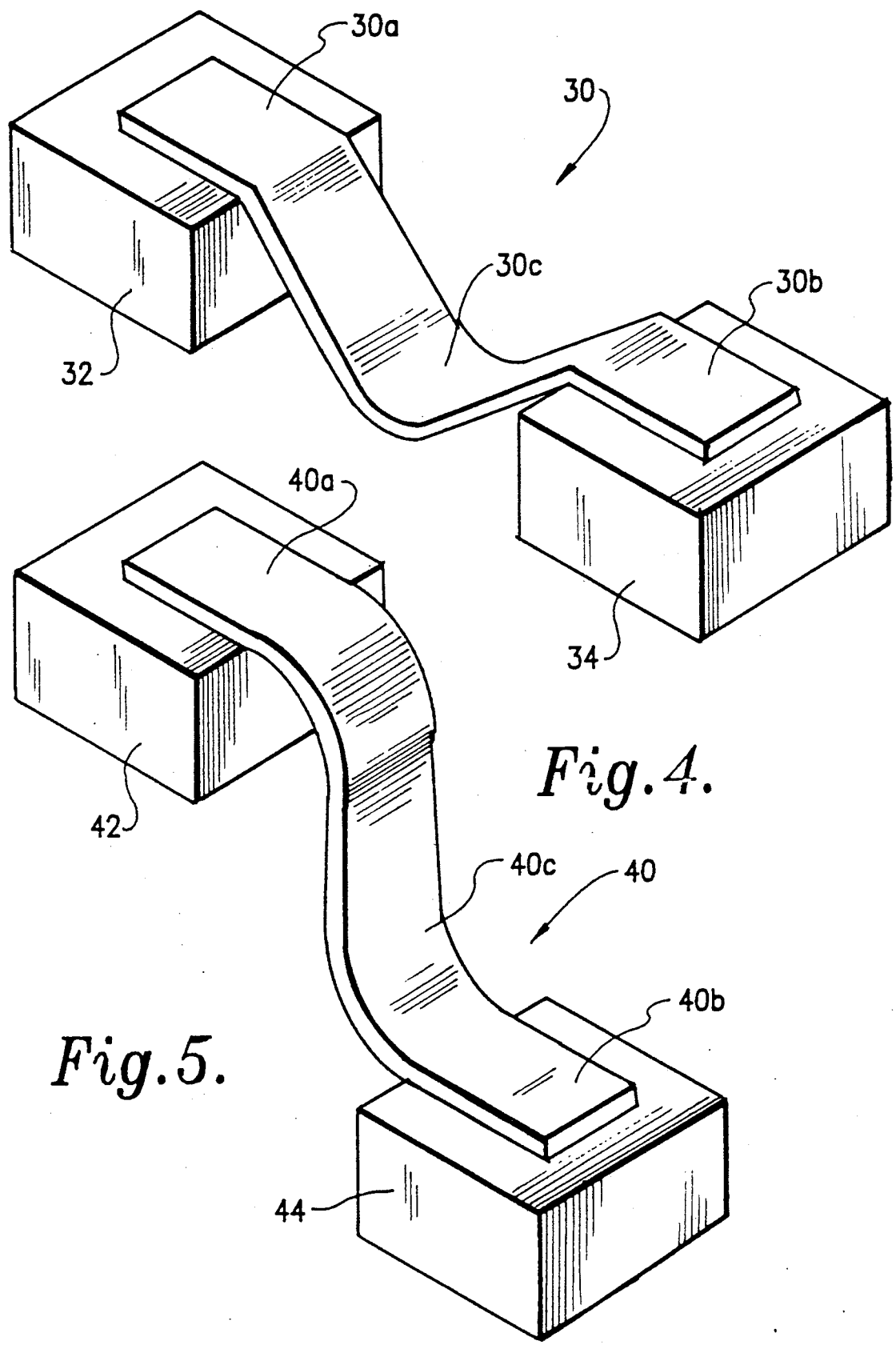

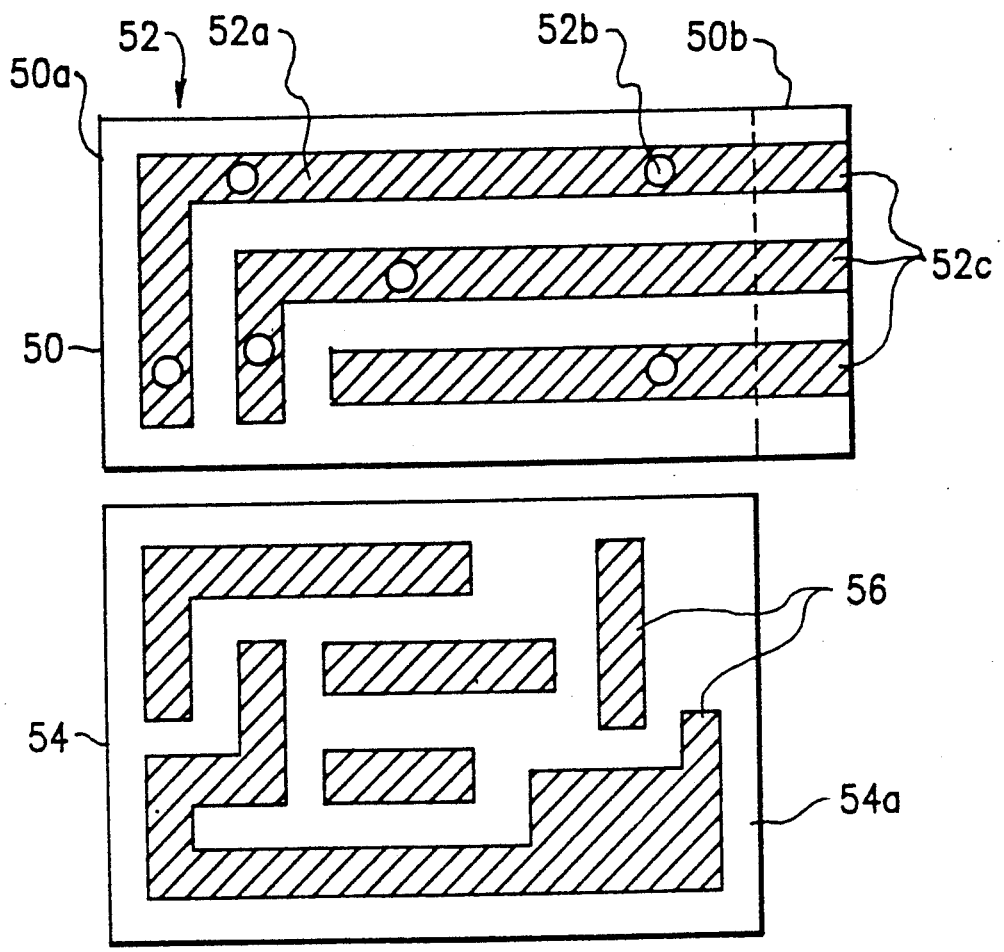
*Fig.6.a.*
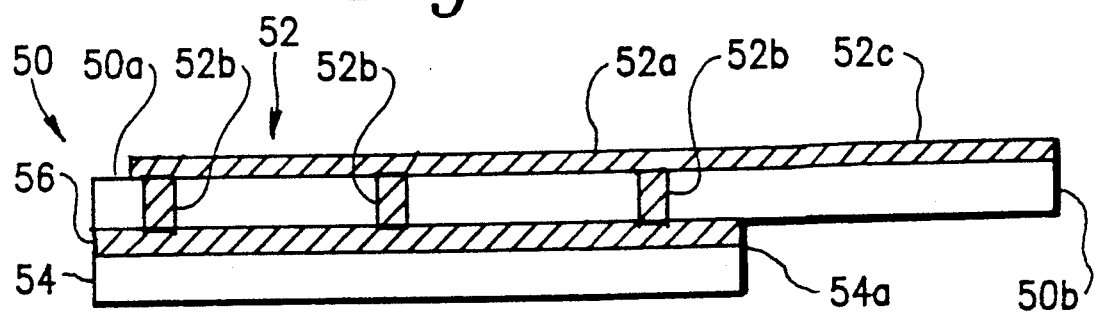
*Fig.6.b.*
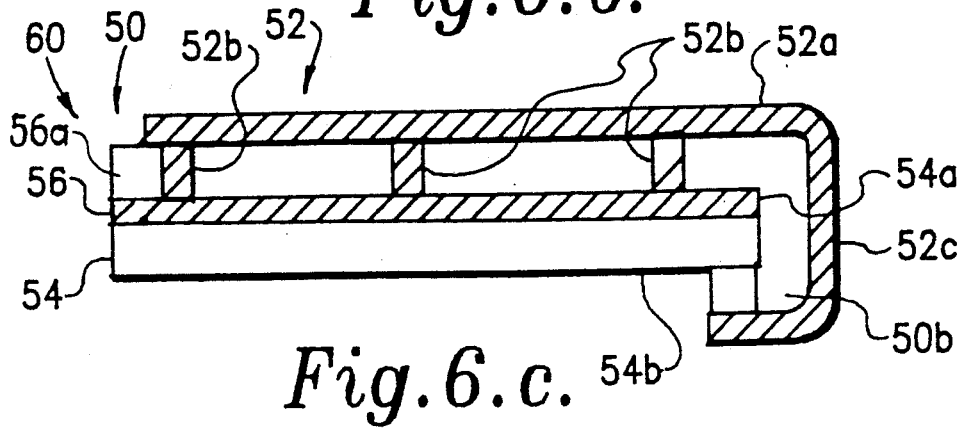
*Fig.6.c.*

THREE DIMENSIONAL MICROCIRCUIT STRUCTURE AND PROCESS FOR FABRICATING THE SAME FROM CERAMIC TAPE

BACKGROUND OF THE INVENTION

1. Field of the Invention

The present invention generally relates to the art of microelectronics, and more specifically to an electrical microcircuit structure and process for fabricating the same from ceramic tape. The structure has a desired non-planar shape, and is especially suitable for hybrid microcircuit technology.

2. Description of the Related Art

Fabrication of multilayer electronic structures for hybrid microcircuit technology and other applications may be classified into three general processes. The first uses a so-called thick film process wherein individual conductor and dielectric compositions in paste form are sequentially deposited on insulating substrates and then fired, one layer of material at a time, in order to build up a thick film, multilayer circuit. A common method for depositing these thick film pastes involves the use of a screen printing process for depositing layers of a dielectric paste on the substrate surface, over any conductive pattern thereon, and then subsequently firing the layers at a predetermined elevated temperature in order to build up a "thick film" of a preferred thickness.

This prior art thick film process provides good fixed registration or positional accuracy, and good dimensional stability by being fired directly on the substrate. The thick film layers are positionally secured and permanently referenced to the substrate. However, a disadvantage of the thick film process is that voids can be formed in the thick film dielectric material during the sequential printing and firing process. Another disadvantage of the thick film process is that the requirement for building up many multiple thick film layers in the more complex hybrid circuits results in an expensive process due to the number of individual processing steps involved.

A third disadvantage of the thick film approach is that the top bonding conductor traces are typically rough and/or rounded as a result of being printed over numerous levels of conductor and dielectric.

The second approach to the fabrication of hybrid microcircuits is the cofired ceramic process. This technology utilizes dielectric material formed into sheets having alumina as a main component. These insulating sheets are then either metallized to make a ground plane, signal plane, bonding plane, or the like, or they are formed with via holes and back filled with metallization to form interconnect layers. Individual sheets of tape are then stacked on each other, laminated together using a predetermined temperature and pressure, and then fired at a desired elevated temperature at which the material fuses or sinters. Where alumina is chosen for the insulating material, tungsten, molybdenum or molymanganese is typically used for metallization, and the part is fired to about 1,600° C. in an $H_2$ reducing atmosphere. An alternative approach to using these base metal conductors is to use platinum or palladium metal and fire in air. These metals, however, are very costly and are rarely used.

The undesirable high processing temperature and requisite $H_2$ atmosphere of the refractory metals has led to the development of Low-Temperature-Cofired-Ceramic (LTCC) tape. LTCCs are under development and/or commercially available from a number of manufacturers including Electro-Science Laboratories, Inc., of Prussia, Pa., EMCA, of Montgomeryville, Pa., and FERRO, of Santa Barbara, Calif. A preferred LTCC, which is known in the art as "green tape", is commercially available from the DuPont Company under the product designation #851AT. The tape contains a material formulation which can be a mixture of glass and ceramic fillers which sinter at about 850° C., and exhibits thermal expansion similar to alumina.

The low-temperature processing permits the use of air fired resistors and precious metal thick film conductors such as gold, silver, or their alloys. In the typical high-temperature process, screen-printed resistors cannot be used and only refractory metal pastes are used as conductors.

A discussion of thick film technology, and high and low temperature cofired ceramic tape technology, is found in "DEVELOPMENT OF A LOW TEMPERATURE COFIRED MULTILAYER CERAMIC TECHNOLOGY", by William Vitriol et al, ISHM Proceedings 1983, pp. 593–598.

One disadvantage of the cofired ceramic approach is that the dielectric film or tape will undergo shrinkage of as much as 20% in each of the X, Y, and Z directions. This shrinkage results in a dimensional uncertainty in the fired part of typically 1%, which may be unacceptable in the fabrication of certain types of hybrid microcircuits.

The third prior art multilayer circuit board fabrication technology is disclosed in U.S. Pat. No. 4,645,552, issued Feb. 24, 1987, entitled "PROCESS FOR FABRICATING DIMENSIONALLY STABLE INTERCONNECT BOARDS", to William Vitriol et al. This process may be described as a "transfer-tape" method, and is performed by providing a generally rigid, conductive substrate, or an insulative substrate on which a conductive circuit pattern is formed, and then transferring and firing a glass-ceramic tape layer to the surface of the substrate. This tape layer provides electrical isolation between the substrate and electrical conductors or electronic components which are subsequently bonded to or mounted on the top surface of the glass-ceramic tape layer. By providing vertical electrical interconnects by means of vias formed in the tape layer prior to firing the tape layer directly on the substrate, good X and Y lateral dimensional stability of the tape material is maintained. The next conductor layer in this vertical interconnect process is then screen printed on the fired tape dielectric and itself fired. This process is repeated until the hybrid circuit is built up to a desired vertical, multilayer interconnect level. As an alternative process to individually firing conductor and dielectric layers, the complete structure or portions thereof can be simultaneously fired as disclosed in the above referenced patent to Vitriol. By replacing a screen printed dielectric layer build-up process with a pre-punched dielectric tape layer, the transfer tape process retains the primary advantages of the thick film process, while gaining many advantages of the cofired ceramic process.

All three of the processes described above produce essentially flat, or planar, circuit structures. The thick film and transfer processes, in particular, utilize relatively rigid substrates which are, by their nature, flat.

Known processes for forming edge connectors on microelectronic circuit boards generally include depositing or otherwise forming conductive strips directly on the edge portions of the boards. This requires at least one process step which is additional to forming intercomponent metallizations and electrical components on the boards.

SUMMARY OF THE INVENTION

The present invention enables the fabrication of three dimensional ceramic circuits or packages that can conform to non-planar surfaces, or which can be formed into irregular shapes for special applications. LTCC dielectric tape softens during firing, and can be molded or shaped into different configurations such as cylinders, right angles, S-shapes, etc. In addition, transfer tape can be laminated to non-planar surfaces using isostatic or semi-isostatic pressing techniques.

With existing two dimensional, or planar, flat structures, circuits can only be mounted in areas that are as flat as the circuits, or are filled with a conformal spacer material which provides a flat mounting surface. By having the capability to form the ceramic tape into various configurations, the possible locations for mounting circuit structures can be extended to a large extent. For example, it becomes possible to line the walls of communication devices, airborne and other vehicles, etc. with electrical circuits. These circuits can constitute "smart skins", which allow electronic circuits to be placed in areas that were not previously accessible. By conforming the structure to the mounting surface, a more efficient thermal path is provided for the removal of heat. Another application is to form I/O connectors integral to the ceramic structure, eliminating the use of external leads. Wrap-around terminations or connector pluggable edge connectors can be printed as part of the normal circuit structure, and then laminated over the edge onto the side of the substrate.

In accordance with the present invention, an electrical circuit pattern is formed on a glass-ceramic, thermally fusible tape. The tape is heated to a temperature at which it becomes temporarily plastic, and is then bent, molded, or otherwise formed into a desired non-planar shape. Further application of heat causes the tape, upon cooling, to be sintered in the non-planar shape. A multi-layer structure can be provided by laminating plural layers of Low-Temperature-Cofired-Ceramic (LTCC) tape with respective circuit patterns formed thereon together, and bending the laminated structure into the non-planar shape during the heating step. As an alternative process, LTCC tape can be formulated so that it is bendable during or after lamination. Thus shapes can be formed, at room or lamination temperatures, prior to the heating step. A circuit structure including an edge connector can be formed by laminating a layer of glass-ceramic transfer tape having an electrical circuit pattern which includes conductor strips formed on an edge connector portion thereof onto a relatively rigid substrate, such that the edge connector portion is bent around an edge of the substrate to form a rigid edge connector. The edge connector portion of the transfer tape which is formed into a non-planar shape during the lamination step is fused together with the remaining portion of the transfer tape onto the substrate during the heating step. A LTCC structure can also have an edge portion bent at a right angle with an edge connector pattern formed thereon to constitute an LTCC plug-in connector.

These and other features and advantages of the present invention will be apparent to those skilled in the art from the following detailed description, taken together with the accompanying drawings, in which like reference numerals refer to like parts.

DESCRIPTION OF THE DRAWINGS

FIGS. 1a to 1c are sectional views illustrating a first embodiment of a process according to the present invention utilizing multi-layer, cofired ceramic tape;

FIGS. 2 to 5 are diagrammatic perspective views illustrating alternative methods for performing the process illustrated in FIGS. 1a to 1c;

FIG. 6a is a plan view illustrating the components of a second embodiment of the present process for forming an edge connector utilizing transfer tape;

FIGS. 6b and 6c are sectional views illustrating the process steps utilizing the components of FIG. 6a;

DETAILED DESCRIPTION OF THE INVENTION

Figure 2:
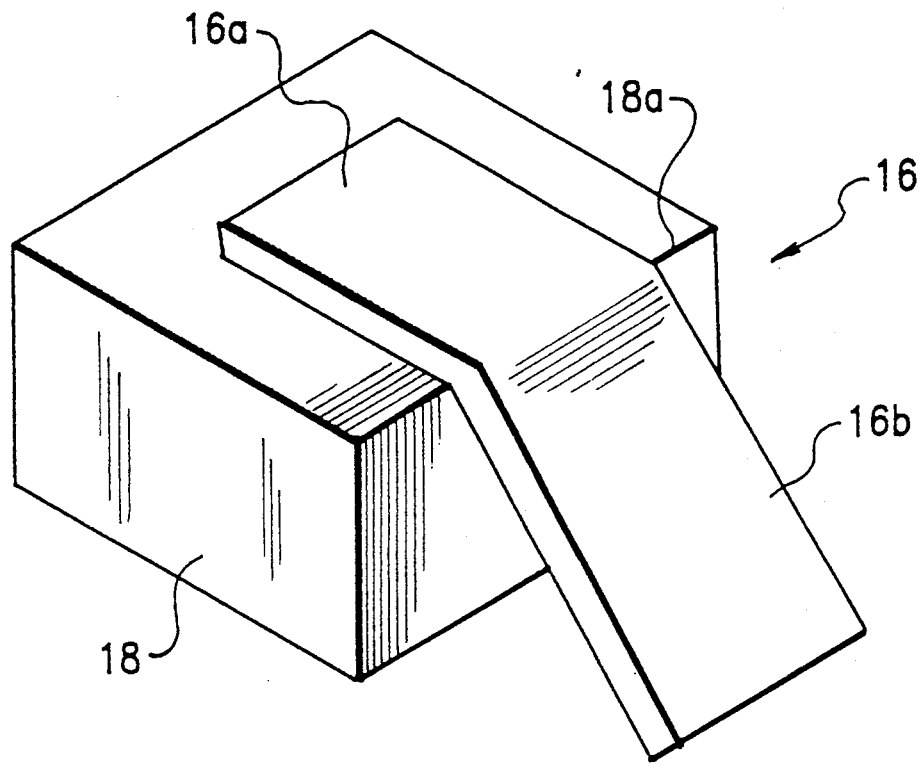

Referring now to FIG. 1a of the drawing, a first embodiment of the invention utilizing LTCC in a multi-layer, cofired configuration includes providing sheets of glass-ceramic tape 10, 12, and 14. The DuPont Green Tape TM Materials system discussed above may preferably be employed, which consists of a low temperature ceramic glass filled dielectric tape (851AT), and cofireable film conductor paste compositions, all of which are designed for compatibility with conventional thick film processing equipment. It will be understood, however, that the invention is not limited to using DuPont tape, and may be practiced using any LTCC tape produced, for example, by any of the manufacturers listed above, which has the required specifications.

Each sheet 10, 12 and 14 is flexible, and has an electrical circuit pattern formed on an upper and/or lower surface thereof. As shown, the patterns consist of metallizations 10a, 12a, and 14a which constitute intercomponent connectors, and via holes 12b and 14b filled with conductive material which vertically interconnects the metallizations 10a-12a, and 12a-14a respectively. The metallizations and filled via holes are preferably formed of a metal such as gold, silver, or copper, although the invention is not so limited. Although the sheets 10, 12, and 14 may be formed of the same LTCC green tape material, the lower sheet 10 may be considered as a substrate since it need not necessarily be formed with via holes, and because the most detailed and dense metallizations are typically formed on the lower sheet. The lower sheet 10 may, however, be formed with via holes for thermal dissipation.

Although the electrical circuit patterns on the sheets are illustrated as consisting only of metallizations and filled via holes, the patterns may further include resistors, capacitors, inductors, or any other electrical components compatible with the process. The metallizations may be formed on the sheets by screening, or any other suitable method.

The sheets 10, 12, and 14, provided as illustrated in FIG. 1a, are stacked on top of each other and laminated together as shown in FIG. 1b to provide an integral electronic circuit structure 16. The lamination force may be isostatic, semi-isostatic, or uniaxial. Typical lamination parameters are a pressure of 3000 psi at a temperature of 70° C.

The final step of the process is illustrated in FIG. 1c, in which the structure 16 is heated to a temperature of approximately 850° C. to 900° C. During this time, the tape becomes temporarily plastic, and the structure 16 can be bent into a desired non-planar shape, illustrated as being a right angle. Further application of heat over time causes the tape to fuse and sinter, with the sheets 10, 12, and 14 fusing together and rigidly hardening, upon cooling, into the non-planar shape. It is within the scope of the present invention to fabricate a single-layer structure, in contrast to a three-layer structure as illustrated, or a multi-layer structure consisting of more than three layers. In addition such structures could be formed at room temperature and then sintered.

As will be described below, the structure may be formed into a wide variety of shapes other than a simple right angle, by causing a force to be applied to the structure in a suitable direction during the heating step. The limiting factor is that a ratio of thickness/bend radius, above which damage to the electrical circuit pattern can result, should not be exceeded. The numerical value of the ratio varies widely depending on the material system and configuration, and is generally determined empirically.

The force may also be applied by supporting a portion of the structure, and allowing gravity to act downwardly on the unsupported portion.

The structure 16 may be produced by supporting the same as shown in FIG. 2 during the heating step of FIG. 1c. A portion 16a of the structure 16 is supported on a substrate or setter 18, with a portion 16b being unsupported. The substrate 18 may be formed of any suitable material to which the structure 16 will not adhere during the fusion or sintering operation. Application of heat causes the tape sheets in the structure 16 to become plastic, so that the force of gravity acting on the unsupported portion 16b is sufficient to bend the same downwardly over an edge 18a of the substrate 18 to form an angle relative to the supported portion 16a. Further application of heat over time causes the tape sheets in the structure 16 to sinter, and harden, upon cooling, in the non-planar shape.

Figure 3:
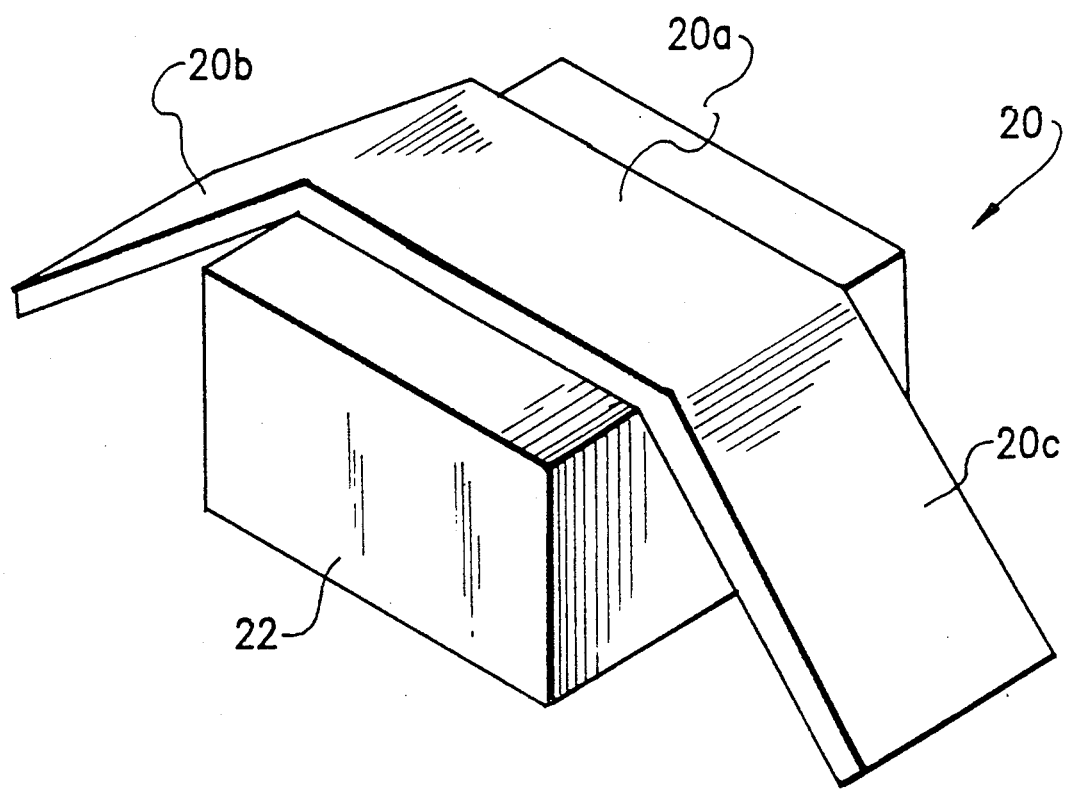

A method of forming a structure with two angles is illustrated in FIG. 3. In this case, a central or inner portion 20a of a structure 20 is supported by a substrate 22. Outer portions 20b and 20c are unsupported, and allowed to be bent downwardly by gravity relative to the supported portion 20a during the heating step.

Another method of shaping a structure 30 of the invention is illustrated in FIG. 4, in which outer portions 30a and 30b are supported by substrates 32 and 34 respectively. An unsupported central portion 30c is allowed to sag between the substrates 32 and 34 during the heating step, resulting in the formation of a curved U-shape.

A variation of the method of FIG. 4 is illustrated in FIG. 5, in which outer portions 40a and 40b of a structure 40 are supported on substrates 42 and 44 respectively. An inner portion 40c of the structure 40 is allowed to sag during the heating step to form a curved S-shape.

The support methods illustrated in FIGS. 2 to 5 are exemplary only, and are not construed to limit the scope of the present invention. It is within the scope of the invention to form an electrical circuit structure consisting of at least one sheet of thermally fusible material formed with a circuit pattern thereon, into any desired non-planar shape by plastically bending or molding the sheet prior to or during the application of heat for fusing and sintering the material.

Another embodiment of the present invention is illustrated in FIGS. 6a to 6c. The process shown in these drawings is designed to form an electrical edge connector on a generally rigid substrate utilizing the transfer tape method.

As viewed in FIG. 6a, a sheet 50 of thermally fusible tape is provided with an electrical circuit pattern 52 formed thereon. The tape is preferably specially formulated for the transfer tape process as disclosed in the above referenced patent to Vitriol. A preferred transfer tape is commercially available from EMCA of Montgomeryville, Pa., which is known in the art as DI-TRAN ™. However, the tape may alternatively be the same LTCC green tape used to practice the method of the invention described above. The sheet 50 has a main portion 50a on which a pattern of metallizations 52a and via holes 52b filled with conductive material are formed, and an edge portion 50b formed with a pattern of edge connector strips 52c which interconnect with the metallizations 52a. The edge connector strips 52c are designed to mate with conjugate conductors of a female edge connector (not shown).

The other main component illustrated in FIG. 6a is a substrate 54 in the form of a generally rigid board. The substrate 54 may be made of alumina or other suitable material, and has an edge 54a. If desired, a single or multi-layer electrical circuit pattern structure 56 may be formed on the substrate 54 using, for example, the transfer tape process disclosed in the above referenced patent to Vitriol. The structure 56 is connected to the metallizations 52a and edge connector strips 52c by the vias 52b. The main portion 50a of the sheet 50 is substantially the same size as the substrate 54.

As viewed in FIG. 6b, the sheet 50 is placed on the substrate 54 so that the main portion 50a thereof is superposed on the substrate 54. Then, as shown in FIG. 6c, the edge portion 50b is bent, by suitable application of mechanical force, over and around the edge 54a onto a back side 54b of the substrate 54, and laminated in place. If desired, the edge portion 50b may extend only over the edge 54a, and not onto the back surface 54b.

A structure 60 produced as shown in FIG. 6c is then heated to fuse the sheet 50 to the substrate 54, and sinter the sheet 50 to produce a rigid configuration. The edge connector thus formed is ready for use without additional processing steps.

Figure 7:
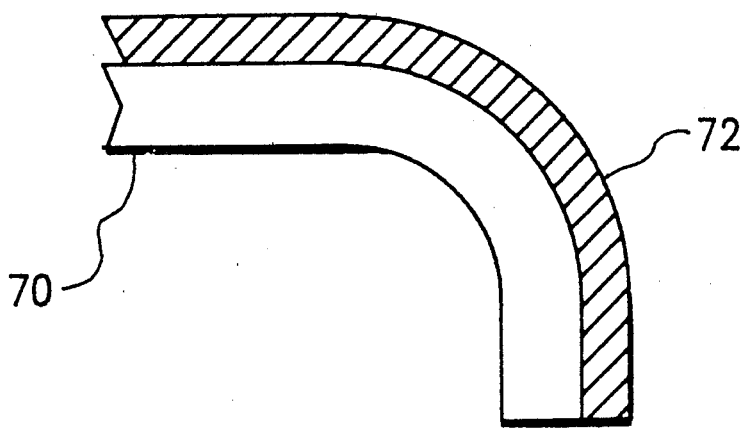
FIG. 7 is a fragmentary sectional view of an alternative edge connector arrangement embodying the invention.

As an alternative edge connector configuration in accordance with the present invention, an LTCC tape structure 70 may be provided with edge connector metallization strips 72 on an upper or outwardly facing surface thereof as illustrated in FIG. 7. The strips 72 are similar to the strips 52c shown in FIGS. 6a to 6c. An edge portion of the structure 70 is bent at a right angle to form an LTCC plug-in connector, with the strips 72 extending over the bent edge portion and designed to mate with conjugate connectors of a female edge connector (not shown).

The method of supporting a part of the structure and allowing gravity to bend an unsupported part of the structure as described above is advantageous in that no mechanism is required which would be exposed to high temperature during the heating process. However, it is fully within the scope of the invention to provide any means for applying force to the tape structure, in any desired direction, which results in bending of the structure into the desired shape. The structure may be bent, shaped, formed, etc., by a movable mechanical arrangement, a molding apparatus, or a pressurizing unit for applying a uniaxial or isostatic force to the structure, by way of example.

Figure 8:
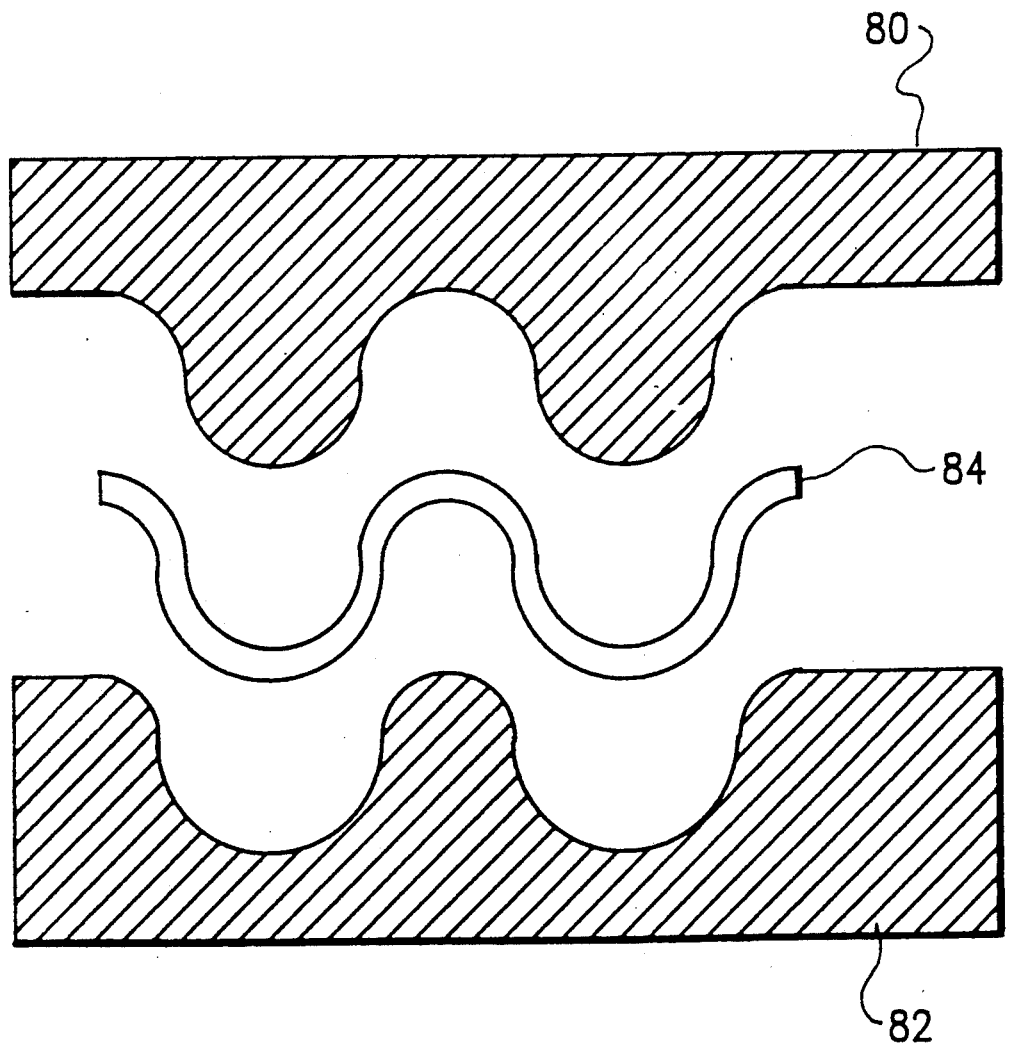
FIG. 8 is a diagram showing how an LTCC structure of the invention can be formed into a desired shape using a mold.

An example of shaping an LTCC structure using a mold is illustrated in FIG. 8. Upper and lower conjugate mold halves 80 and 82 are movable toward and away from each other to form an LTCC structure 84 therebetween into a shape corresponding to the mold inner surfaces prior to or during the sintering step of the structure. The mold halves 80 and 82 may be formed of any suitable material, and may further be coated with a releasing agent selected to prevent sticking of the LTCC structure 84 thereto during heating and subsequent cooling of the structure.

Although LTCC green tape is a preferred material for practicing the invention, other material systems such as high temperature cofired tape may be used. It is desirable, however, to keep the temperature applied during the heating step below 1000° C., as this allows the use of non-refractory metallizations (gold, silver, copper), and screen printed resistors on the tape, which cannot be formed at temperatures above approximately 1000° C. The preferred temperature range for practicing the invention using conventional green tape is on the order of 850°–900° C. However, the invention is not so limited, and other material systems may enable the process of the invention to be practiced at a lower temperature.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A process for fabricating an electrical circuit structure, comprising the steps of:
   (a) providing a substrate;
   (b) providing a flexible, thermally fusible sheet having an electrical circuit pattern formed on a surface thereof;
   (c) laminating a surface of the sheet opposite to the surface on which the pattern is formed onto the substrate; and
   (d) heating the substrate and sheet to a temperature which causes the sheet to fuse to the substrate; steps (c) and (d) in combination including causing the sheet to bend into a non-planar shape, and thermally fuse to the substrate in the non-planar shape.

2. A process as in claim 1, further comprising the step, performed between steps (a) and (c), of:
   (e) forming an electrical circuit pattern on a surface of the substrate;
   steps (c) and (d) comprising laminating and fusing the sheet to the surface of the substrate on which the electrical pattern is formed.

3. A process as in claim 1, in which the substrate provided in step (a) is substantially rigid and has an edge, step (c) comprising bending an edge portion of the sheet over the edge of the substrate, and laminating the edge portion of the sheet to the edge of the substrate.

4. A process as in claim 3, in which step (b) comprises providing the electrical circuit pattern on the edge portion of the surface of the sheet in the form of an electrical edge connector.

5. A process as in claim 3, in which step (c) further comprises bending the edge portion of the sheet around the edge of the substrate, and laminating said bent around edge portion of the sheet to a back surface of the substrate.

6. A process as in claim 1, in which steps (a) and (c) comprise providing each of the substrate and sheet in the form of thermally fusible tape, the process further comprising the step, performed between steps (a) and (c), of:
   (e) forming an electrical circuit pattern on a surface of the substrate;
   steps (c) and (d) comprising laminating and fusing the sheet to the surface of the substrate on which the electrical pattern is formed.

7. A process as in claim 6, in which:
   step (c) includes laminating the substrate and sheet together to form a substantially planar shape; and
   step (d) includes causing a force to be applied to the laminated substrate and sheet which causes the substrate and sheet to plastically deform into the non-planar shape.

8. A process as in claim 7, in which step (d) comprises releasably supporting a first portion of the laminated substrate and sheet, heating the substrate and sheet to said temperature which further causes the tape of the substrate and sheet to become plastic, and allowing an unsupported second portion of the laminated substrate and sheet to be plastically bent downwardly by gravity relative to the first portion.

9. A process as in claim 8, in which step (a) comprises providing each of the substrate and sheet in the form of co-fired, glass-ceramic tape, said temperature being less than substantially 1000° C.

10. A process for forming an electrical circuit structure having an edge connector, comprising the steps of:
    (a) providing a substantially rigid substrate having an edge;
    (b) providing a sheet of thermally fusible transfer tape having an electrical edge connector pattern formed on an edge portion of a surface thereof;
    (c) laminating a surface of the tape opposite to the surface on which the pattern is formed onto the substrate such that the edge portion of the tape is bent over and laminated to the edge of the substrate; and
    (d) heating the substrate and tape to a temperature which causes the tape to fuse to the substrate.

11. A process as in claim 10, in which step (c) further comprises bending the edge portion of the tape around the edge of the substrate, and laminating said bent around edge portion of the tape to a back surface of the substrate.

12. A process for fabricating a ceramic tape electrical circuit structure, comprising the steps of:
    (a) providing a thermally fusible ceramic tape having an electrical circuit pattern formed on a surface thereof;
    (b) heating the tape to a temperature which causes the tape to become temporarily plastic, and causing the tape to be bent into a non-planar shape while plastic; and
    (c) further heating the tape to a temperature which causes the tape to sinter, and upon cooling, causing the tape to become sintered in the non-planar shape.

13. A process as in claim 12, in which step (b) comprises releasably supporting a first portion of the tape, and allowing an unsupported second portion of the tape to be plastically bent downwardly by gravity relative to the first portion.

14. A process for fabricating a co-fired ceramic tape electrical circuit structure, comprising the steps of:
   (a) laminating together a plurality of layers of glass-ceramic tape having electrical circuit patterns formed thereon respectively to form an integral structure;
   (b) heating the structure to a temperature which causes the tape to become temporarily plastic, and causing the structure to be bent into a non-planar shape while the tape is plastic; and
   (c) further heating the structure to a temperature at which the tape sinters, and causing the tape to become sintered in the non-planar shape.

15. A process as in claim 14, in which step (b) comprises releasably supporting a first portion of the structure, and allowing an unsupported second portion of the structure to be plastically bent downwardly by gravity relative to the first portion.

16. A process as in claim 14, in which step (b) comprises releasably supporting an inner portion of the structure, and allowing unsupported outer portions of the structure to be plastically bent downwardly by gravity relative to the central portion.

17. A process as in claim 14, in which step (b) comprises releasably supporting outer portions of the structure, and allowing an unsupported inner portion of the structure to be plastically bent downwardly by gravity relative to the outer portions.

18. An electrical circuit structure, comprising:
   a substrate; and
   a sintered ceramic sheet having a non-planar shape, and an electrical circuit pattern formed on a surface thereof;
   a surface of the sheet opposite to the surface on which the pattern is formed being thermally fused to the substrate.

19. A structure as in claim 18, in which a surface of the substrate to which the sheet is fused has an electrical circuit pattern formed thereon.

20. A structure as in claim 18, in which the substrate is substantially rigid and has an edge, the sheet having an edge portion which is bent over and thermally fused to the edge of the substrate.

21. A structure as in claim 20, in which the electrical circuit pattern formed on the sheet comprises an electrical edge connector pattern formed on the edge portion thereof.

22. A structure as in claim 20, in which the edge portion of the sheet is further bent around the edge of the substrate and fused to a back surface thereof.

23. A structure as in claim 18, in which the substrate and sheet each comprise thermally fusible tape, and are integrally sintered into the non-planar shape.

24. A structure as in claim 23, in which the thermally fusible tape is glass-ceramic tape.

25. An electrical circuit structure comprising a sintered ceramic sheet which is plastically formed from thermally fusible tape into a non-planar shape, and an electrical circuit pattern formed on a surface of the sheet.

26. A structure as in claim 25, in which the thermally fusible tape is glass-ceramic tape.

27. An electrical circuit structure comprising a plurality of sintered ceramic sheets formed from thermally fusible tape, each sheet having an electrical circuit pattern formed on a surface thereof, the sheets being laminated and thermally fused together, and integrally formed into a non-planar shape.

28. A structure as in claim 27, in which thermally fusible tape is glass-ceramic tape.

29. A structure as in claim 27, comprising an edge connector portion which includes a substantially right angle bend, the structure further including an electrical edge connector pattern formed on the outwardly facing surface of the edge connector portion.

30. A process for fabricating a co-fired ceramic tape electrical circuit structure, comprising the steps of:
   (a) laminating together a plurality of layers of glass-ceramic tape having electrical circuit patterns formed thereon respectively to form an integral structure;
   (b) heating the structure to a temperature which causes the tape to become temporarily plastic, and molding the structure into a non-planar shape while the tape is plastic; and
   (c) further heating the structure to a temperature at which the tape sinters, and causing the tape to become sintered in the non-planar shape.

* * * * *